United States Patent
Hernandez et al.

(10) Patent No.: US 7,633,419 B2
(45) Date of Patent: Dec. 15, 2009

(54) SIGNAL CONVERSION USING FINITE IMPULSE RESPONSE FEEDBACK

(75) Inventors: Luis Hernandez, Madrid (ES); Dietmar Straussnigg, Villach (AT); Andreas Wiesbauer, Portschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/032,248

(22) Filed: Feb. 15, 2008

(65) Prior Publication Data

US 2009/0207060 A1    Aug. 20, 2009

(51) Int. Cl.
*H03M 3/00* (2006.01)
(52) U.S. Cl. .................................. 341/143; 341/155
(58) Field of Classification Search .............. 341/143, 341/144, 155, 157
See application file for complete search history.

(56) References Cited

U.S. PATENT DOCUMENTS

| | | | | |
|---|---|---|---|---|
| 5,323,157 | A | * | 6/1994 | Ledzius et al. ............. 341/143 |
| 5,375,146 | A | * | 12/1994 | Chalmers ................... 375/350 |
| 6,208,279 | B1 | * | 3/2001 | Oprescu ..................... 341/143 |
| 7,183,957 | B1 | * | 2/2007 | Melanson ................... 341/143 |
| 2005/0052299 | A1 | * | 3/2005 | Oliaei ......................... 341/143 |
| 2007/0069929 | A1 | * | 3/2007 | Mallinson .................. 341/143 |
| 2008/0107282 | A1 | * | 5/2008 | Asada ...................... 381/71.14 |

OTHER PUBLICATIONS

Oliaei, "Continuous-Time Sigma-Delta Modulator Incorporating Semi-Digital FIR Filters," Circuits and Systems, ISCAS '03, Proceedings of the 2003 International Symposium 2003, pp. I-957 to I-960.

* cited by examiner

*Primary Examiner*—Peguy JeanPierre
(74) *Attorney, Agent, or Firm*—Lee & Hayes, PLLC

(57) ABSTRACT

Techniques for converting signals using finite impulse response (FIR) feedback are described herein.

20 Claims, 3 Drawing Sheets

US 7,633,419 B2

SIGNAL CONVERSION USING FINITE IMPULSE RESPONSE FEEDBACK

BACKGROUND

Converters for converting analog signals to digital signals (and vice versa) are found in a wide variety of devices, including compact disc (CD) players, digital video disc (DVD) players, signal processors, and various other systems that communicate signals. In general, the accuracy and quality of the signal conversion process increases with increasing sampling rate provided that the noise introduced by the digitization process (i.e., sampling and quantization) is properly taken into consideration.

Multi-stage noise shaping (MASH) converters may be used to separate and remove noise, particularly for applications in which oversampling is used, such as in certain pulse-width-modulation (PWM) converters. The term oversampling refers to the use of sampling frequencies that exceed a frequency dictated by the Nyquist theorem in order to boost signal-to-noise ratio and reduce quantization noise. Unfortunately, such conventional converter devices remain sensitive to noise introduced by jitter in the sampling clock signal.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

Disclosed herein are improved techniques for reducing noise and providing improved conversion signals in electronic components, including pulse width modulation (PWM) oversampling converters, by performing signal conversion having finite impulse response (FIR) feedback. Implementations in accordance with the present disclosure may advantageously reduce the sensitivity of the conversion process to jitter in the sampling clock, thereby reducing noise and providing improved conversion signals. Such techniques may also provide improved reconfigurability, and may use less surface area, in comparison with conventional signal conversion techniques.

Techniques for providing conversion signals using FIR feedback in accordance with the present disclosure may be implemented in a number of ways. An exemplary environment and an exemplary system for implementing such techniques are described in the following section.

Exemplary Environment and System

Figure 1:
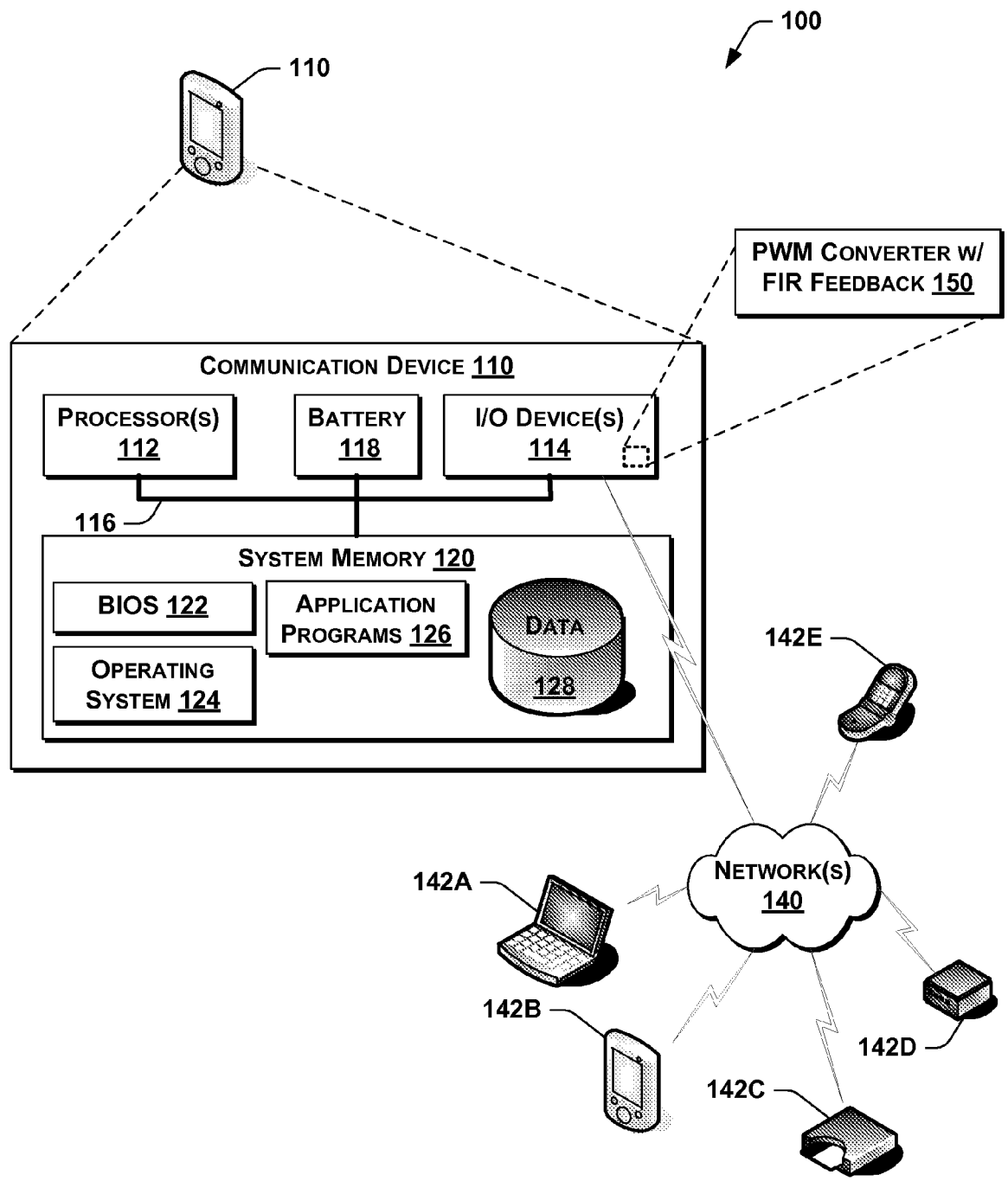
FIG. 1 is an exemplary environment in which techniques in accordance with the present disclosure may be implemented.

FIG. 1 illustrates an exemplary environment 100 in which techniques in accordance with the present disclosure may be implemented. In this implementation, the environment 100 includes a communication device 110 having one or more pulse-width modulation (PWM) converters 150 configured with finite impulse response (FIR) feedback in accordance with the teachings of the present disclosure. The communication device 110 operatively communicates via one or more networks 140 with a plurality of other devices 142. Additionally or alternatively, the communication device 110 may bypass the networks 140 and communicate directly with one or more of the other devices 142. Detailed descriptions of various aspects of the PWM converter 150 are provided in the following sections with reference to FIGS. 2 and 3.

In the representative environment 100, the communication device 110 may be a hand-held device, such as an MP3 player, a personal data assistant (PDA), a global positioning system (GPS) unit, or other similar hand-held device. The other devices 142 in the environment 100 may include, for example, a computer 142A, another hand-held device 142B, a compact disc (CD) or digital video disc (DVD) player 142C, a signal processor 142D (e.g., radio, navigational unit, television, etc.), and a cell phone 142E. Of course, the devices 110, 142 may include any other suitable devices, and it is understood that any of the other devices 142 may be equipped with PWM converters 150 having FIR feedback in accordance with further implementations of the present disclosure.

In the implementation shown in FIG. 1, the communication device 110 includes one or more processors 112 and one or more input/output (I/O) devices 114 (e.g., transceivers, transmitters, receivers, etc.) coupled to a system memory 120 by a bus 116. A power source 118 (e.g. battery) provides power to the components of the communication device 110. In this implementation, the PWM converter 150 having FIR feedback is included as a component within the I/O devices 114 of the communication device 110. In alternative implementations, however, the PWM converter 150 may be integrated with any other suitable portion of the device 110 (e.g. processors 112, power source 118, etc.), or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The I/O component 114 may be configured to operatively communicate with one or more external networks 140, such as a cellular telephone network, a satellite network, an information network (e.g., Internet, intranet, cellular network, cable network, fiber optic network, LAN, WAN, etc.), an infrared or radio wave communication network, or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media may include computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

Generally, program modules executed on the device 110 (FIG. 1) may include routines, programs, objects, components, data structures, etc., for performing particular tasks or implementing particular abstract data types. These program modules and the like may be executed as a native code or may be downloaded and executed such as in a virtual machine or other Just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for use of the PWM converter 150 having FIR feedback in accordance with present disclosure. Similarly, the device 110 is simply one non-limiting example of a suitable device that may include PWM converters 150 having FIR feedback in accordance with the present disclosure.

PWM Converters Having FIR Feedback

Figure 2:
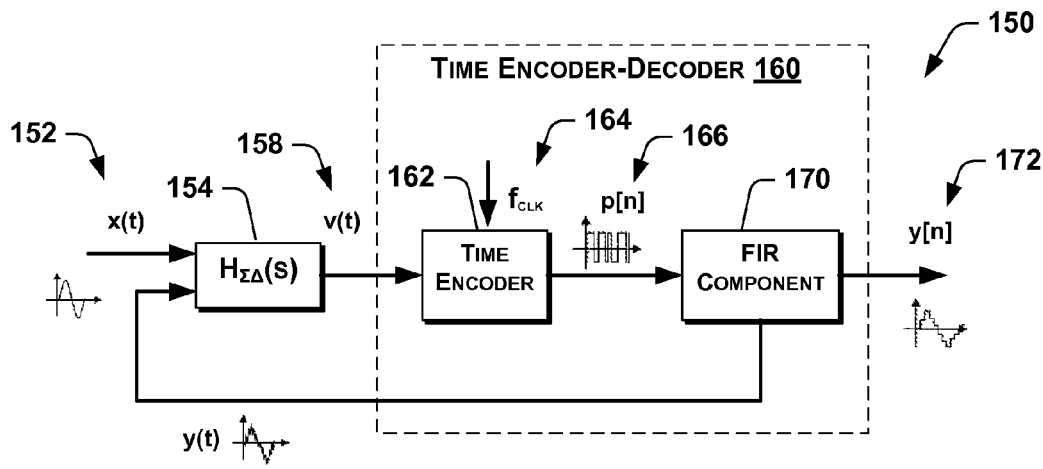
FIG. 2 is an exemplary pulse width modulation (PWM) converter having finite impulse response (FIR) feedback in accordance with an implementation of the disclosure.

Structural and operational aspects of implementations of pulse width modulation (PWM) converters having finite impulse response (FIR) feedback in accordance with the present disclosure will now be described. For example, a PWM converter 150 having FIR feedback in accordance with an implementation of the present disclosure is shown in FIG. 2. In this implementation, the PWM converter 150 is an analog-to-digital converter.

More specifically, an input analog signal 152 (or x(t)) arrives at a signal-shaping component 154 having a design described by a complex transfer function $H_{\Sigma A}(s)$ in the Laplace plane which combines a feedback signal 156 (or y(t)) with the input analog signal 152. In some implementations, the signal-shaping component 154 comprises a filter of a type used in continuous time sigma delta modulator, also referred to as a "sigma delta filter."

A shaped output 158 (or v(t)) from the signal-shaping component 154 is provided to a time encoder-decoder portion 160 of the PWM converter 150. More specifically, a time encoder 162 samples the shaped output 158 (or v(t)) at a clock frequency 164 (or $f_{clk}$) and encodes it into a binary Pulse Width Modulated (PWM) signal 166 (or p[n]). More specifically, in some embodiments, the shaped output 158 is encoded with time information based on the clock signal 164 such that the resulting encoded signal 166 carries multi-level information in its duty cycle. The PWM signal 166 is provided to finite impulse response (FIR) component 170 which generates the feedback signal 156 (or y(t)) which is a decoded version of the PWM signal 166 (or p[n]) similar to the shaped output 158 (or v(t)). The FIR component 170 seizes the properties of the pulse width modulation to generate y(t) from p[n], and feeds the feedback signal y(t) back to the signal shaping component 154 to close a modulator loop (e.g. a sigma delta modulator loop).

As further shown in FIG. 2, the FIR component 170 also decodes the PWM signal 166 into a multibit digital signal 172 (or y[n]). The multibit digital signal y[n] is noise-shaped, and may be equivalent to a digital signal that may be produced by a conventional multibit sigma delta modulator, such as a multibit sigma delta modulator having, for example, a flash quantizer.

Figure 3:
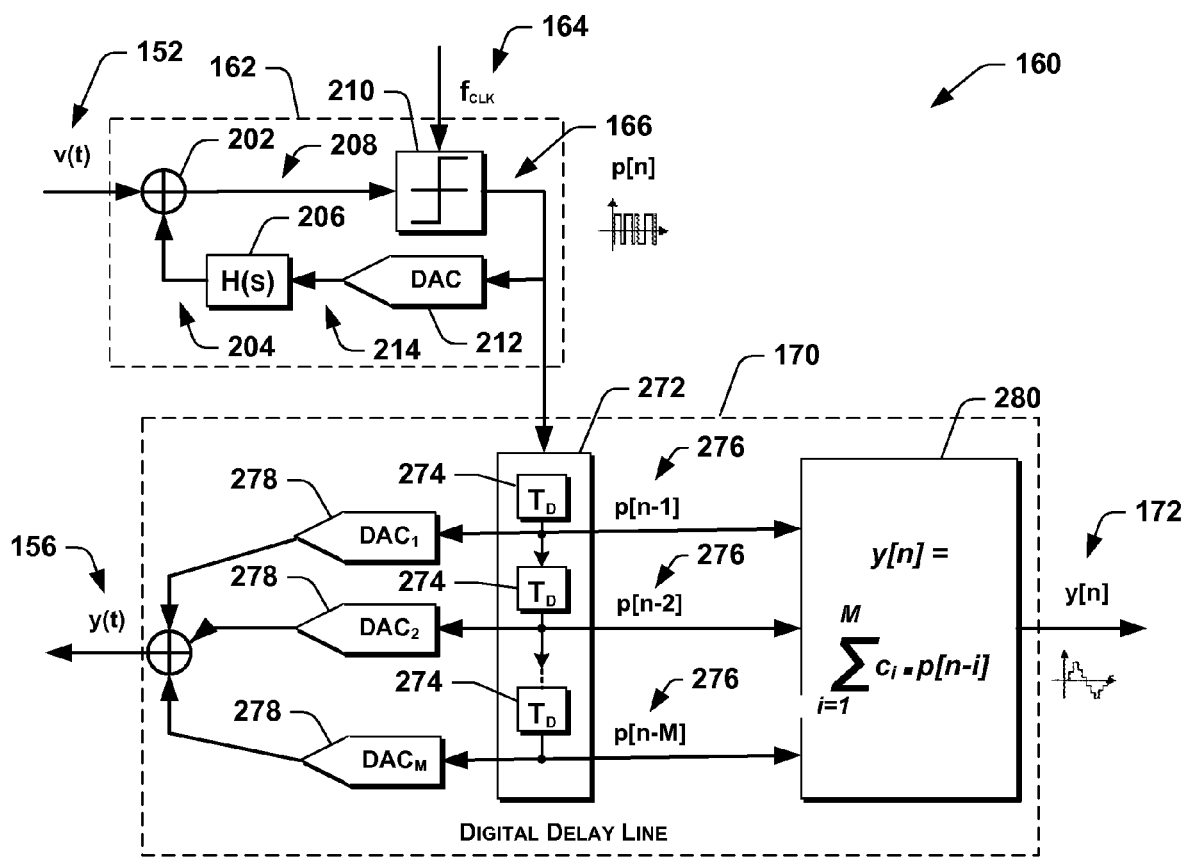
FIG. 3 is an exemplary time encoder-decoder having an FIR component in accordance with an implementation of the disclosure.

FIG. 3 is an exemplary time encoder-decoder portion 260 (suitable for use in the PWM converter 150 of FIG. 2) in accordance with an implementation of the disclosure. In this implementation, the time encoder 162 of the time encoder-decoder portion 260 includes a combiner 202 that receives the shaped signal 152 (or v(t)) from the shaping component 154. The combiner 202 combines the shaped signal 152 with a filtered output 204 from a loop filter 206 (having a design described by a complex transfer function H(s) in the Laplace plane) to provide an intermediate signal 208 to a quantizer 210.

The quantizer 210 (or other suitable analyzer) provides the Pulse Width Modulated (PWM) signal 166 (or p[n]) based on the intermediate signal 208 at the clock frequency 164 (or $f_{clk}$). For example, in some implementations, as described more fully in co-pending, commonly-owned German application DE 10233391 by Laaser Peter, incorporated herein by reference, the PWM signal 166 (or p[n]) may assume a binary value as follows: PWM signal 166=A for intermediate signal 208 greater than or equal to zero; and PWM signal 166=b for intermediate signal 208 less than zero. In a particular embodiment, A=1 and b=−1 when the intermediate signal 208 is within a range from −1 to 1, inclusive (i.e., −1≦the intermediate signal 208≦1).

The PWM signal 166 from the quantizer 210 is provided to a digital-to-analog converter 212. A resulting analog signal 214 is provided to the loop filter 206 which provides the filtered output 204 as a feedback signal to the combiner 202.

As further shown in FIG. 3, the binary PWM signal 166 from the time encoder 162 is provided to the FIR component 170. More specifically, a digital delay line 272 receives the PWM signal 166. The digital delay line 272 includes a plurality of delay stages 274. Each delay stage 274 provides a delay time $T_D$, and operates on a digital signal with only two values, and hence, can be built with digital logic.

For example, in some implementations, the digital delay line 272 may be a clocked delay line. Such a clocked delay line may have a shift register that includes "D" flip flop devices that combine to provide the delay time $T_D$, and that is clocked with the same clock (e.g. clock frequency 164 (or $f_{clk}$)) as the quantizer 210. Alternately, the digital delay line 272 may be a continuous time delay line. In some implementations, the continuous time delay line may include a cascade of logic gates (e.g. inverters) which propagate the PWM signal 166, and which introduce a propagation delay $T_P$ between each successive stage typical of the particular logic gate of the chosen technology. This may in some cases be similar to running a clocked delay line with a clock of period $T_P$.

The FIR component 170 further includes a plurality of digital-to-analog converters (DACs) 278 that tap into the digital delay line 272 after each of the delay stages 274. In some implementations, the DACs 278 are single-bit converters. The analog outputs from the DACs 278 are combined by a second combiner 280 to provide the analog feedback signal 156 that is fed back to the shaping component 154 (FIG. 2). Because the analog feedback signal 156 is generated using the FIR component 170, it is a multi-level, modulated signal. In other words, the analog feedback signal 156 provided by the FIR component 170 is composed of discrete steps, as opposed to an output from a continuous time filter (such as a conventional RC (resistor-capacitor) network) which provides a smooth time domain feedback signal (e.g. a sine wave signal).

In some implementations, the DACs 278 may be current-based (or current-output) digital-to-analog converters, rather than voltage-based (or voltage-output) digital-to-analog converters. Such current-based DACs 278 may be significantly less sensitive to inaccuracies in comparison with voltage-based DACs.

In some implementations, the $i^{th}$ DAC 278 may have a reference current (or voltage) that is proportional to a coefficient $c_i$ of an FIR filter. The FIR filter may be computed by truncating a sampled equivalent impulse response of a filter H(s). More specifically, assuming an input response h(t) of a filter H(s), the coefficient $c_i$ is given by:

$$c_i = h(i \cdot T_P), i=1 \ldots M \quad (1)$$

The coefficients $c_i$ may be determined a priori using analytical, empirical, or semi-empirical methods. In addition, the coefficients $c_i$ may be adjusted to reconfigure the PWM converter 150 (or more specifically, the FIR component 170) as needed or desired.

The length M of the digital delay line 272 of the FIR component 170 may be chosen so that the FIR component 170 approximates a desired filter H(s) that provides a suitable analog feedback signal 156 (or y(t)). In addition, the outputs p[n−i] from the delay line 272 may be used to generate the digital signal 172 (or y[n]). In some embodiments, the digital signal y[n] may be calculated using a summation component 280 that receives the outputs p[n−i] from the delay line 272 and that implements the FIR component 170 using digital logic and the vector of coefficients $c_i$ stored in memory as follows:

$$y[n] = \sum_{i=1}^{M} c_i \cdot p[n-i] \quad (2)$$

It will be appreciated that the PWM converter 150 described above with respect to FIGS. 2 and 3 is merely an exemplary implementation, and that a variety of alternate implementations may be conceived. For example, alternate implementations may be conceived for other types of converters, including non-PWM converters and non-MASH converters, based on the PWM converter implementation 150 described above. In further implementations, other electronic devices and components may be conceived that incorporate techniques signal conversion using FIR feedback in accordance with the teachings of the present disclosure including, for example, scanning components (e.g., for digitizing photographs, videotape, text, etc.), digital audio components, or any other suitable digitization devices.

Exemplary Process

An exemplary process for signal conversion including FIR feedback in accordance with the present disclosure will now be described. For simplicity, the process will be described with reference to the exemplary environment 100 of FIG. 1, and the exemplary PWM converter 150 described above with reference to FIGS. 2 and 3. In the described implementation, the signal conversion process is an analog-to-digital conversion process.

Figure 4:
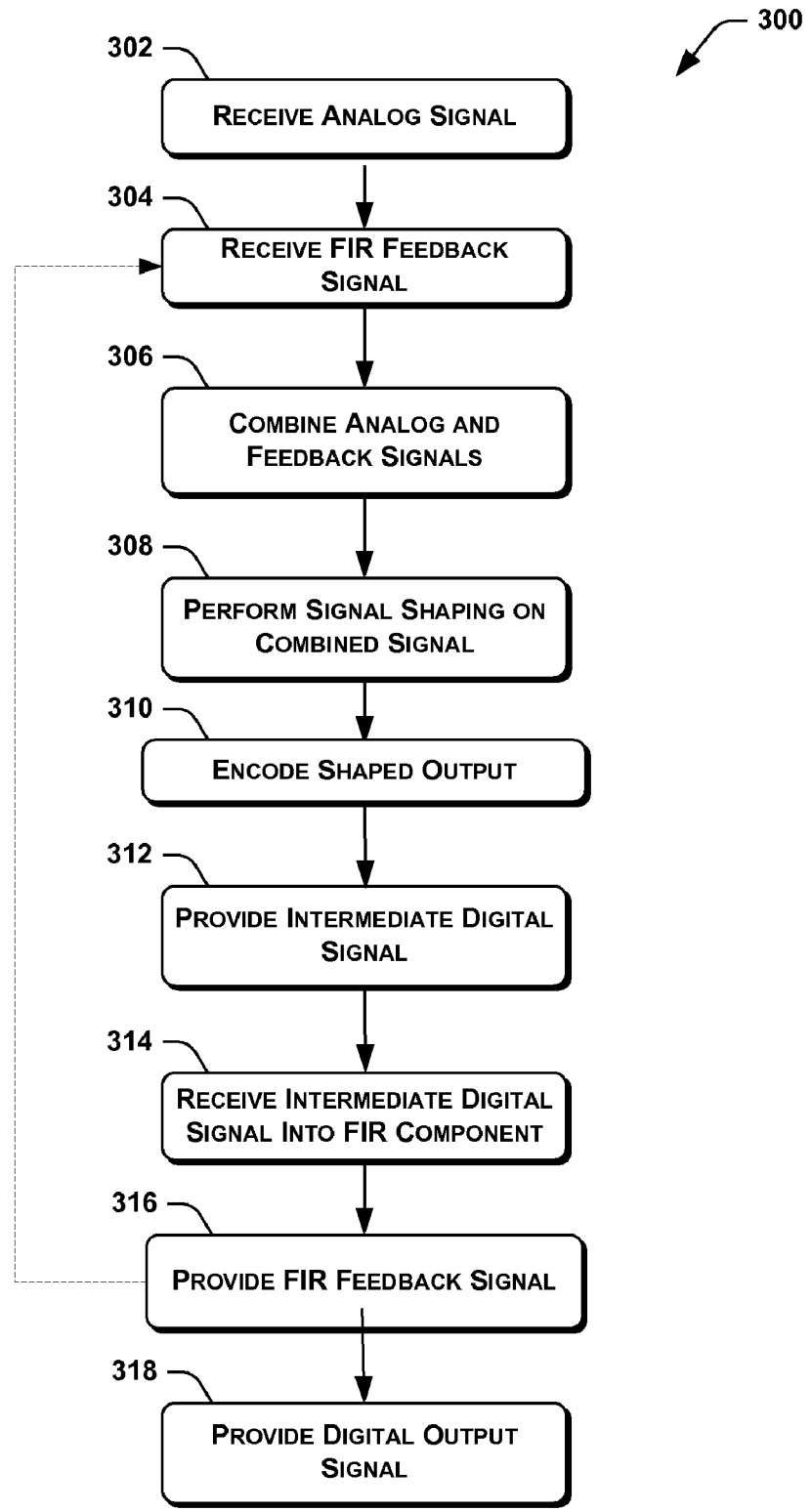
FIG. 4 is a flowchart of a process for converting signals using FIR feedback in accordance with another implementation of the present disclosure.

For example, FIG. 4 is a flowchart of a process 300 for converting signals using FIR feedback in accordance with an implementation of the present disclosure. At 302, an analog signal is received, and a finite impulse response (FIR) feedback signal is received at 304. The analog and FIR feedback signals are combined into a combined signal at 306, and signal shaping is performed on the combined signal at 308. In some implementations, the shaping may be performed using a sigma-delta filter, a multi-stage noise shaping (MASH) component, or any other suitable signal-shaping component.

A shaped output resulting from the signal shaping (at 308) is encoded at 310, and an intermediate digital signal is provided at 312. For example, in some implementations, the shaped output is encoded into a pulse width modulated (PWM) signal. More specifically, the shaped output may be received by a time encoder that quantizes the shaped output into a PWM intermediate digital signal. The time encoder may, for example, quantize an intermediate signal 208 resulting from a combination of the incoming shaped output and a feedback signal 204 provided by a converter (e.g. DAC 212) and a filter (e.g. filter 206). For example, in some embodiments, the quantizer 210 may generate a PWM signal 166 (or p[n]) having a binary value as follows: PWM signal 166=A for intermediate signal 208 greater than or equal to zero; and PWM signal 166=b for intermediate signal 208 less than zero. In a particular embodiment, A=1 and b=−1 when the intermediate signal 208 is within a range from −1 to 1, inclusive (i.e., −1≦the intermediate signal 208≦1).

With continued reference to FIG. 4, the intermediate digital signal is provided to a finite impulse response (FIR) component at 314. In some embodiments, the intermediate digital signal is received into a digital delay line of an FIR component, wherein the digital delay line has a plurality of delay stages. More specifically, in some implementations, the digital delay line 272 may be a clocked delay line. In a particular embodiment, a clocked delay line may include a plurality of flip flop devices (e.g. "D" flip flop devices) that combine to provide a delay time $T_D$, and that is clocked with the same clock (e.g. clock frequency 164 (or $f_{clk}$)) as the quantizer 210. Alternately, the digital delay line may be a continuous time delay line. For example, in some implementations, the continuous time delay line may include a cascade of logic gates (e.g. inverters) which propagate the incoming digitized signal and which introduces a propagation delay $T_P$ between each successive stage typical of the particular logic gate of the chosen technology.

At 316, the FIR component provides the FIR feedback signal that is received (at 304) and combined (at 306) with the incoming analog signal. As described more fully above, in some implementations, the FIR feedback signal is a combination of analog outputs that are formed by a plurality of digital-to-analog converters (DACs) 278 that tap into the digital delay line 272 after each of the delay stages 274. The analog outputs from the DACs 278 may be combined by a combiner 280 to provide the analog FIR feedback signal 156.

A digital output signal is then provided at 318. In some implementations, the digital output signal may be calculated by summing a plurality of outputs p[n−i] from the delay line taken after each of the delay stages of the delay line, using the summation shown in Equation (2) above, wherein the coefficients $c_i$ are determined using Equation (1) above.

It should be appreciated that the process 300 is one possible implementation of the teachings disclosed herein, and that the present disclosure is not limited to the particular process implementation described above and shown in FIG. 4. For example, in alternate implementations, certain acts need not be performed in the order described, and may be modified, and/or may be omitted entirely, depending on the circumstances. Moreover, in various implementations, the acts described may be implemented by a computer, controller, processor, programmable device, or any other suitable device, and may be based on instructions stored on one or more computer-readable media or otherwise stored or programmed into such devices. In the event that computer-readable media are used, the computer-readable media can be any available media that can be accessed by a device to implement the instructions stored thereon.

Techniques in accordance with the teachings of the present disclosure may provide significant advantages. For example, techniques for signal conversion using FIR feedback signals may advantageously provide improved tolerance to jitter in the sampling clock due to the multilevel nature of the output. Significantly, because the DACs 278 of the FIR component may be current-based (or current controlled) digital-to-analog converters, rather than voltage-based (or voltage controlled) digital-to-analog converters, the FIR component may be significantly easier to implement, and may be significantly less sensitive to inaccuracies and may provide superior performance over alternate signal conversion techniques.

In addition, differences between the multibit digital output y[n] and the analog output y(t) (if any) may generally be linear, thereby providing a multibit feedback converter which does not require mismatch shaping or calibration. Further, the FIR component in accordance with the present disclosure may be implemented using less surface area than a comparable filter H(s) that may require, for example, relatively large capacitors. And the modulation aspects of the FIR component may be reconfigurable by changing the coefficients $c_i$ as desired.

Accordingly, techniques in accordance with the present disclosure may advantageously reduce or eliminate at least some noise that may otherwise occur in the digitization process in electronic components, including PWM converters. Such techniques may provide improved conversion signals, using less surface area, and providing improved reconfigurability, in comparison with conventional signal conversion techniques.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. Accordingly, the scope of the invention should not be limited by the disclosure of the specific implementations set forth above. Instead, the invention should be determined entirely by reference to the claims that follow.

What is claimed is:

1. A conversion circuit, comprising:
  a signal-shaping component configured to receive an input signal and a feedback signal and to provide a shaped signal based on the input and feedback signals;
  an encoder coupled to receive the shaped signal and a clock signal and to provide an intermediate encoded output signal based on the shaped signal and the clock signal; and
  a finite impulse response (FIR) component having a delay line coupled to receive the intermediate encoded output, the delay line including a plurality of delay stages, the FIR component being configured to provide the feedback signal to the signal-shaping component and to provide a converted output signal, wherein the FIR component includes a plurality of signal converters, each signal converter being coupled to the delay line following a successive delay stage and configured to convert a successive delay stage signal to a successive converted signal.

2. The circuit as recited in claim 1, wherein the input signal comprises an analog input signal and the converted output signal comprises a digital output signal.

3. The circuit as recited in claim 1, wherein the signal-shaping component comprises a sigma-delta shaping component.

4. The circuit as recited in claim 1, wherein the delay line comprises a clocked delay line.

5. The circuit as recited in claim 4, wherein the encoder includes a quantizer that encodes the shaped signal with time information based on the clock signal such that the resulting encoded signal carries multi-level information in its duty cycle, and wherein the clocked delay line includes a plurality of flip flop devices that combine to provide a delay time, the clocked delay line being clocked using the clock signal.

6. The circuit as recited in claim 1, wherein the delay line comprises a continuous time delay line.

7. The circuit as recited in claim 6, wherein the continuous time delay line includes a cascade of logic gates which cooperatively introduce a propagation delay between each successive delay stage.

8. The circuit as recited in claim 1, wherein the FIR component further includes
  a combining component configured to combine the successive converted signals into the feedback signal.

9. The circuit as recited in claim 1, wherein the FIR component further includes a combining component coupled to the delay line and configured to receive a plurality of successive delayed signals, each successive delayed signal being provided following a successive delay stage of the delay line, the combining component being configured to determine the converted output signal based on the plurality of successive delayed signals.

10. The circuit as recited in claim 9, wherein the combining component determines the converted output signal as follows:

$$y[n] = \sum_{i=1}^{M} c_i \cdot p[n-i]$$

where y[n] is the converted output signal,
  i is an index number,
  M is a total number of delay stages of the delay line,
  p[n−i] is the successive delayed signal following the $(n-i)^{th}$ delay stage of the delay line, and
  $c_i$ is a coefficient given by $c_i = h(i \cdot T_P)$, i=1 ... M,
    where h is a shaping function, and Tp is a time delay attributable to the successive delay stage.

11. An electronic device, comprising:
  a processor; and
  a communication component operatively coupled to the processor and configured to at least one of receive and transmit communication signals, the communication component including a converter having:

a signal-shaping component configured to receive an input signal and a feedback signal and to provide a shaped signal based on the input and feedback signals;

an encoder coupled to receive the shaped signal and a clock signal and to encode the shaped signal with time information based on the clock signal to provide an intermediate encoded output, such that a duty cycle of the intermediate encoded output carries multi-level information; and a finite impulse response (FIR) component having a delay line coupled to receive the intermediate encoded output, the delay line including a plurality of delay stages, the FIR component being configured to provide the feedback signal to the signal-shaping component and to provide a converted output signal.

12. The device as recited in claim 11, wherein the converter comprises an analog-to-digital converter.

13. The device as recited in claim 11, wherein the encoder includes a quantizer that encodes the shaped signal based on the clock signal, and wherein the delay line includes a plurality of flip flop devices that combine to provide a delay time, the delay line being clocked using the clock signal.

14. The device as recited in claim 11, wherein the delay line includes a cascade of logic gates which cooperatively introduce a propagation delay between each successive delay stage.

15. The device as recited in claim 11, wherein the FIR component further includes:

a plurality of signal converters, each converter being coupled to the delay line following a successive delay stage and configured to convert a successive delay stage signal to a successive converted signal;

a first combining component configured to combine the successive converted signals into the feedback signal; and a second combining component coupled to the delay line and configured to receive a plurality of successive delayed signals, each successive delayed signal being provided following a successive delay stage of the delay line, the second combining component being configured to determine the converted output signal based on the plurality of successive delayed signals.

16. A method of converting signals, comprising:

combining an input signal with an analog feedback signal, by a communication device including a pulse width modulation converter, to provide a combined signal;

shaping the combined signal, by the communication device, to provide a shaped signal;

encoding the shaped signal, by the communication device, to provide an intermediate signal;

successively delaying the intermediate signal, by the communication device, using a plurality of delay stages to provide a plurality of delayed signals;

converting the plurality of delayed signals, by the communication device, into a corresponding plurality of converted signals;

combining, by the communication device, the plurality of converted signals into the analog feedback signal using a finite impulse response component of the pulse width modulation converter; and combining, by the communication device, the plurality of delayed signals into a converted digital output signal using the finite impulse response component.

17. The method as recited in claim 16, wherein encoding a shaped signal to provide an intermediate signal includes encoding a shaped analog signal to provide an intermediate digital signal.

18. The method as recited in claim 17, wherein encoding a shaped analog signal to provide an intermediate digital signal includes encoding a shaped analog signal to provide an intermediate pulse width modulated signal.

19. The method as recited in claim 16, wherein successively delaying the intermediate signal includes successively delaying the intermediate signal using a finite impulse response component having a delay line that includes a plurality of delay stages, and wherein converting the plurality of delayed signals includes converting the plurality of delayed signals obtained between successive delay stages of the delay line using a corresponding plurality of analog-to-digital converters, each analog-to-digital converter providing a corresponding one of the plurality of converted signals.

20. The method as recited in claim 16, wherein successively delaying the intermediate signal includes successively delaying the intermediate signal using a finite impulse response component having a delay line that includes a plurality of delay stages, and wherein combining the plurality of delayed signals into a converted output signal includes multiplying each of the plurality of delayed signals by a coefficient to provide a successive product, and combining the plurality of successive products in a combining component to determine the converted output signal.

* * * * *

UNITED STATES PATENT AND TRADEMARK OFFICE
CERTIFICATE OF CORRECTION

| | | |
|---|---|---|
| PATENT NO. | : 7,633,419 B2 | Page 1 of 1 |
| APPLICATION NO. | : 12/032248 | |
| DATED | : December 15, 2009 | |
| INVENTOR(S) | : Luis Hernandez et al. | |

It is certified that error appears in the above-identified patent and that said Letters Patent is hereby corrected as shown below:

On the Title Page,

Column 1, line 75, change "Straussnigg" to "Straeussnigg"

Signed and Sealed this
Twelfth Day of November, 2013

Teresa Stanek Rea
*Deputy Director of the United States Patent and Trademark Office*